United States Patent
Yu et al.

(10) Patent No.: US 10,516,033 B2
(45) Date of Patent: Dec. 24, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chih-Hao Yu, Tainan (TW); Sheng-chen Wang, Hsinchu (TW); Sai-Hooi Yeong, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/960,096

(22) Filed: Apr. 23, 2018

(65) Prior Publication Data
US 2018/0240891 A1    Aug. 23, 2018

Related U.S. Application Data

(62) Division of application No. 15/486,549, filed on Apr. 13, 2017, now Pat. No. 9,954,076, which is a division
(Continued)

(51) Int. Cl.
*H01L 29/66* (2006.01)
*H01L 27/088* (2006.01)
(Continued)

(52) U.S. Cl.
CPC .. *H01L 29/66545* (2013.01); *H01L 21/76232* (2013.01); *H01L 21/823431* (2013.01);
(Continued)

(58) Field of Classification Search
CPC ....... H01L 29/66545; H01L 21/823481; H01L 21/823431; H01L 27/0886; H01L 21/76232; H01L 29/66795
See application file for complete search history.

(56) References Cited

U.S. PATENT DOCUMENTS 8,513,078 B2    8/2013    Shieh et al.
8,847,295 B2    9/2014    Shieh et al.
(Continued)

FOREIGN PATENT DOCUMENTS

CN    103177950 A    6/2013
TW    200947608 A    11/2009

OTHER PUBLICATIONS

Non-Final Office Action U.S. Appl. No. 14/932,383 dated Jun. 8, 2016.
(Continued)

*Primary Examiner* — Yasser A Abdelaziez
(74) *Attorney, Agent, or Firm* — McDermott Will & Emery LLP

(57) ABSTRACT

A semiconductor device includes first and second FETs including first and second channel regions, respectively. The first and second FETs include first and second gate structures, respectively. The first and second gate structures include first and second gate dielectric layers formed over the first and second channel regions and first and second gate electrode layers formed over the first and second gate dielectric layers. The first and second gate structures are aligned along a first direction. The first gate structure and the second gate structure are separated by a separation plug made of an insulating material. A width of the separation plug in a second direction perpendicular to the first direction is smaller than a width of the first gate structure in the second direction, when viewed in plan view.

20 Claims, 13 Drawing Sheets

Related U.S. Application Data of application No. 14/932,383, filed on Nov. 4, 2015, now Pat. No. 9,659,930.

(51) Int. Cl.
  *H01L 21/762* (2006.01)
  *H01L 21/8234* (2006.01)

(52) U.S. Cl.
  CPC .. *H01L 21/823481* (2013.01); *H01L 27/0886* (2013.01); *H01L 29/66795* (2013.01)

(56) References Cited

U.S. PATENT DOCUMENTS

| | | | | |
|---|---|---|---|---|
| 9,331,074 | B1* | 5/2016 | Chang | H01L 27/0886 |
| 9,406,804 | B2* | 8/2016 | Huang | H01L 29/7853 |
| 9,601,567 | B1 | 3/2017 | Hsieh | |
| 2007/0004129 | A1 | 1/2007 | Lee et al. | |
| 2013/0164924 | A1 | 6/2013 | Shieh et al. | |
| 2013/0313646 | A1 | 11/2013 | Shieh et al. | |
| 2015/0228647 | A1 | 8/2015 | Chang et al. | |
| 2015/0325482 | A1 | 11/2015 | Hu et al. | |
| 2016/0204215 | A1* | 7/2016 | Chang | H01L 21/845 257/401 |
| 2016/0300948 | A1 | 10/2016 | Yang et al. | |
| 2017/0148682 | A1* | 5/2017 | Basker | H01L 21/823431 |
| 2017/0229479 | A1* | 8/2017 | Ok | H01L 21/823871 |

OTHER PUBLICATIONS

Non-Final Office Action U.S. Appl. No. 14/932,383 dated Sep. 8, 2016.
Notice of Allowance U.S. Appl. No. 14/932,383 dated Jan. 20, 2017.
Notice of Allowance issued in U.S. Appl. No. 15/486,549, dated Mar. 13, 2018.

* cited by examiner

SEMICONDUCTOR DEVICE AND MANUFACTURING METHOD THEREOF

CROSS-REFERENCE TO RELATED APPLICATIONS

This application is a Divisional Application of U.S. Ser. No. 15/486,549, filed Apr. 13, 2017, which is a Divisional Application of U.S. Ser. No. 14/932,383, filed Nov. 4, 2015, the subject matter of which is incorporated herein by reference in entirety.

TECHNICAL FIELD

The disclosure relates to a semiconductor integrated circuit, and more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structures (e.g., wrapping) utilizing the advantage of the increased surface area of the channel and source/drain regions to produce faster, more reliable and better-controlled semiconductor transistor devices. A metal gate structure together with a high-k gate dielectric having a high electric dielectric constant is often used in Fin FET device, and is fabricated by a gate-replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-10D show cross sectional and/or plan views of exemplary sequential processes of manufacturing the Fin FET device according to one embodiment of the present disclosure. It is understood that additional operations can be provided before, during, and after processes shown by FIGS. 1-10D, and some of the operations described below can be replaced or eliminated, for additional embodiments of the method. The order of the operations/processes may be interchangeable.

Figure 1:
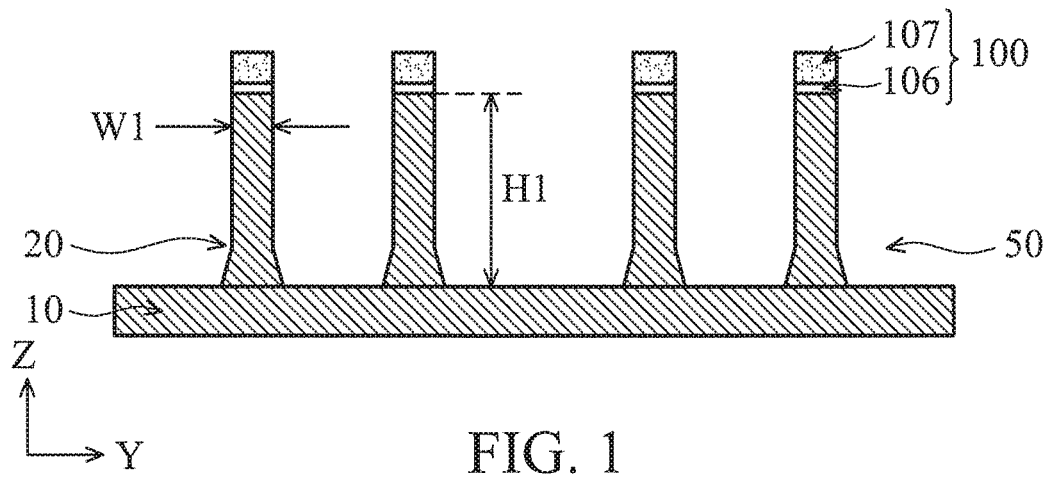
FIGS. 1-10D show exemplary sequential processes for manufacturing an FET device according to one embodiment of the present disclosure.

FIG. 1 shows an exemplary cross sectional view in which fin structures 20 are formed over a substrate 10. To fabricate a fin structure, a mask layer is formed over the substrate (e.g., a semiconductor wafer) by, for example, a thermal oxidation process and/or a chemical vapor deposition (CVD) process. The substrate is, for example, a p-type silicon substrate with an impurity concentration being in a range from about $1\times10^{15}$ cm$^{-3}$ and about $5\times10^{15}$ cm$^{-3}$. In other embodiments, The substrate is an n-type silicon substrate with an impurity concentration being in a range from about $1\times10^{15}$ cm$^{-3}$ and about $5\times10^{15}$ cm$^{-3}$.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer includes, for example, a pad oxide (e.g., silicon oxide) layer and a silicon nitride mask layer in some embodiments. The pad oxide layer may be formed by using thermal oxidation or a CVD process. The silicon nitride mask layer may be formed by a physical vapor deposition (PVD), such as sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range from about 2 nm to about 15 nm and the thickness of the silicon nitride mask layer is in a range from about 2 nm to about 50 nm in some embodiments. A mask pattern is further formed over the mask layer. The mask pattern is, for example, a photo resist pattern formed by photo lithography.

By using the mask pattern as an etching mask, a hard mask pattern 100 of the pad oxide layer 106 and the silicon nitride mask layer 107 is formed.

By using the hard mask pattern as an etching mask, the substrate is patterned into fin structures 20 by trench etching using a dry etching method and/or a wet etching method.

The fin structures 20 disposed over the substrate 10 are made of the same material as the substrate 10 and continuously extend from the substrate 10 in one embodiment. The fin structures 20 may be intrinsic, or appropriately doped with an n-type impurity or a p-type impurity.

In FIG. 1, four fin structures 20 are disposed. These fin structures are used for a p-type Fin FET and/or an n-type Fin FET. The number of the fin structures is not limited to four. The numbers may be as small as one, or more than four. In addition, one of more dummy fin structures may be disposed adjacent both sides of the fin structures 20 to improve pattern fidelity in patterning processes. The width W1 of the fin structures 20 is in a range from about 5 nm to about 40 nm in some embodiments, and is in a range from about 7 nm to about 20 nm in certain embodiments. The height H1 of the fin structures 20 is in a range from about 100 nm to about 300 nm in some embodiments, and is a range of about 50 nm to 100 nm in other embodiments. When the heights of the fin structures are not uniform, the height from the substrate may be measured from the plane that corresponds to the average heights of the fin structures.

Figure 2:
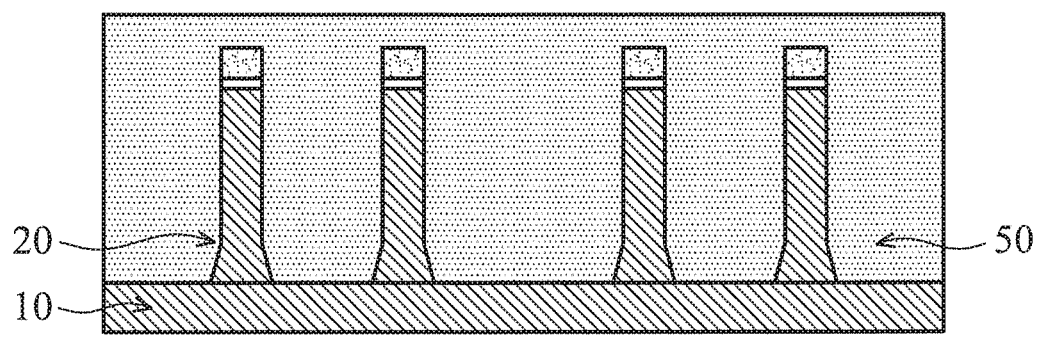

As shown in FIG. 2, an insulating material layer 50 to form an isolation insulating layer is formed over the substrate 10 so as to fully cover the fin structures 20.

The insulating material for the isolation insulating layer 50 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The isolation insulating layer 50 may be SOG, SiO, SiON, SiOCN or fluorine-doped silicate glass (FSG). The isolation insulating layer 50 may be doped with boron and/or phosphorous.

Figure 3:
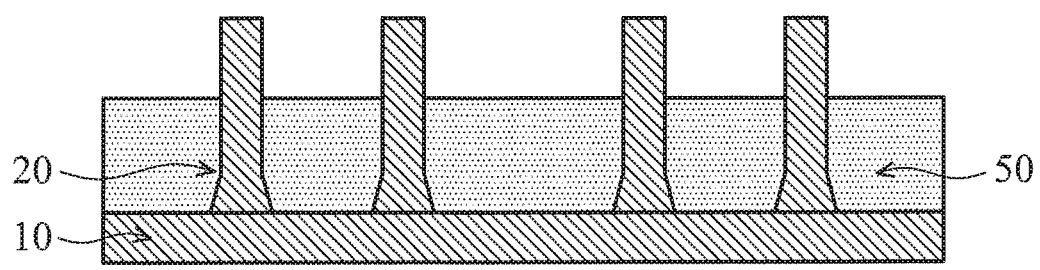

After forming the isolation insulating layer 50, a planarization operation is performed so as to remove upper part of the isolation insulating layer 50 and the mask layer 100 including the pad oxide layer 106 and the silicon nitride mask layer 107. Then, the isolation insulating layer 50 is further removed so that an upper part of the fin structures 20, which is to become a channel region, is exposed, as shown in FIG. 3.

After forming the isolation insulating layer 50, a thermal process, for example, an anneal process, is optionally performed to improve the quality of the isolation insulating layer 50. In certain embodiments, the thermal process is performed by using rapid thermal annealing (RTA) at a temperature in a range from about 900° C. to about 1050° C. for about 1.5 seconds to about 10 seconds in inert gas ambient, for example, $N_2$, Ar or He ambient.

After the upper portions of the fin structures 20 are exposed from the isolation insulating layer 50, a gate insulating layer 105 and a poly silicon layer are formed over the isolation insulating layer 50 and the exposed fin structures 20, and then patterning operations are performed so as to obtain a gate layer 110 made of poly silicon, as shown in FIGS. 4A-4D. The gate insulating layer 105 may be silicon oxide formed by CVD, PVD, ALD, e-beam evaporation, or other suitable process. A thickness of the poly silicon layer is in a range from about 5 to about 100 nm in some embodiments. In the gate replacement technology described with FIGS. 9A-10D, the gate insulating layer 105 and gate layer 100 are both dummy layers which are eventually removed.

After the patterning the poly silicon layer, sidewall insulating layers 80 (sidewall spacers) are also formed at both side faces of the gate layer 110. The sidewall insulating layers 80 is made of one or more layers of silicon oxide or silicon nitride based materials such as SiN, SiCN, SiON or SiOCN. In one embodiment, silicon nitride is used.

After the sidewall insulating layers 80 are formed, an insulating layer 90 to be used as a contact-etch stop layer (CESL) is formed over the poly silicon layer 110 and the sidewall insulating layer 80. The CESL layer 90 is made of one or more layers of silicon oxide or silicon nitride based materials such as SiN, SiCN, SiON or SiOCN. In one embodiment, silicon nitride is used.

Further, an interlayer dielectric layer (ILD) 70 is formed in spaces between the gate layers 110 with the side-wall insulating layers 80 and the CESL 90 and over the gate layer 110. The ILD 70 may include silicon oxide, silicon nitride, silicon oxynitride (SiON), SiOCN, fluorine-doped silicate glass (FSG), or a low-K dielectric material, and may be made of CVD or other suitable process. The insulating material for the isolation insulating layer 50 may be the same as or different from that for the ILD 70.

Figure 4A:
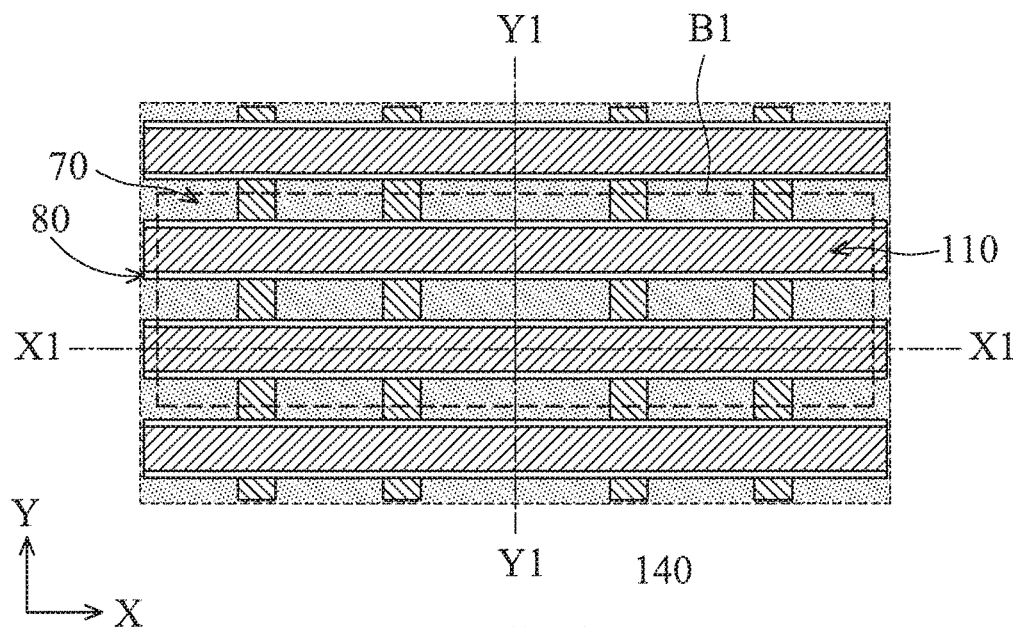
Figure 4B:
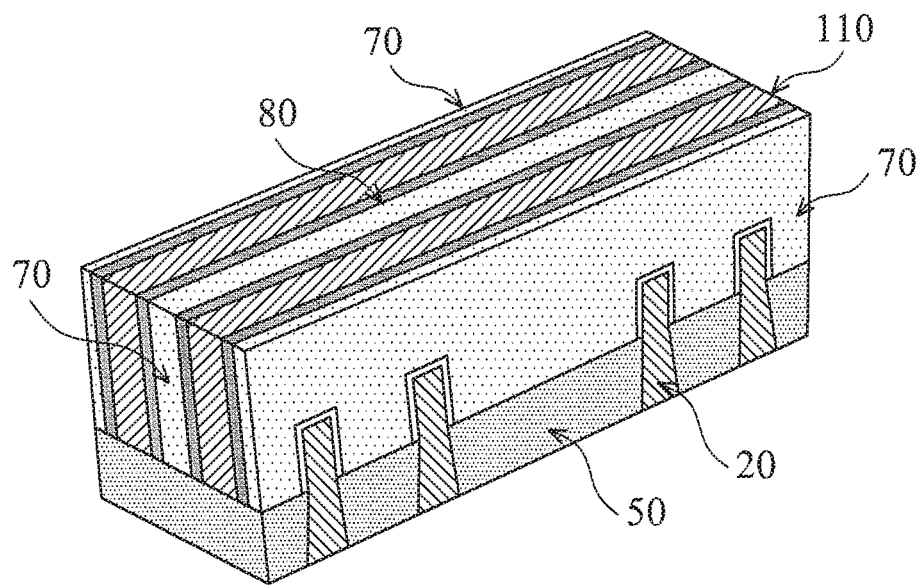
Figure 4C:
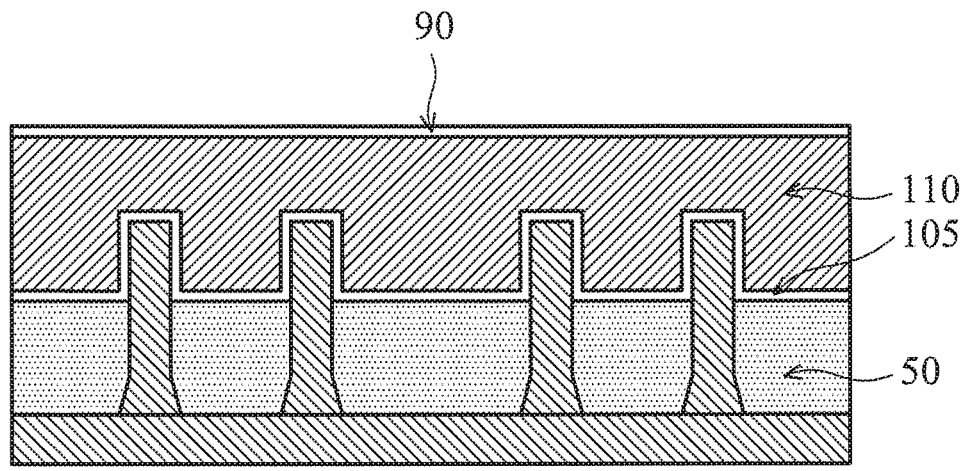
Figure 4D:
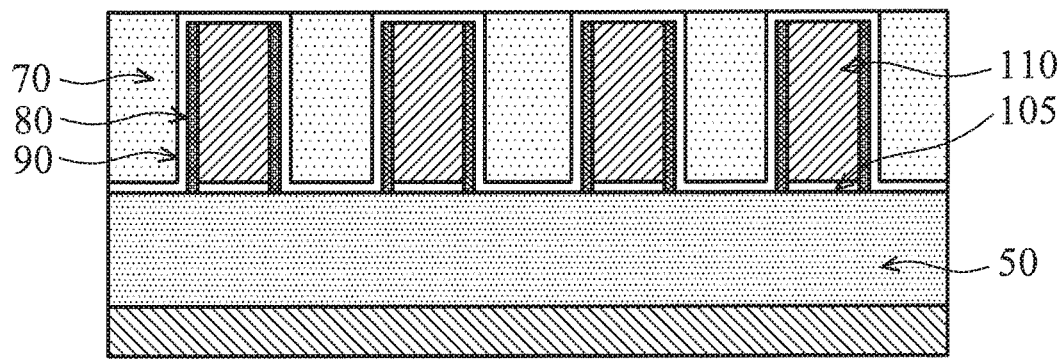

Planarization operations, such as an etch-back process and/or a chemical mechanical polishing (CMP) process, are performed, so as to obtain the structure shown in FIGS. 4A-4D. FIG. 4A is a plane view (top view) and FIG. 4B is a perspective view of the Fin FET device after the gate layer 110 and the interlayer dielectric layer 70 are formed. FIGS. 1-3 and 4C correspond to cross sectional views along line X1-X1 in FIG. 4A, FIG. 4D correspond to a cross sectional view along line Y1-Y1 in FIG. 4A, and FIG. 4B corresponds to the enclosed portion B1 in FIG. 4A.

As shown in FIGS. 4A and 4B, the gate layers 110 are formed in a line-and-space arrangement extending in one direction (X direction) with a constant pitch. The gate layers 110 may include another line-and-space arrangement extending in another direction (Y direction) perpendicular to the one direction, and another line-and-space arrangement with different dimensions.

The gate layers 110 cover the channel regions of the Fin FETs formed with the fin structures 20. In other words, the gate layers 110 are formed over the channel regions. The fin structures not covered by the gate layers will become source/drain regions by appropriate source/drain fabrication operations.

Figure 5A:
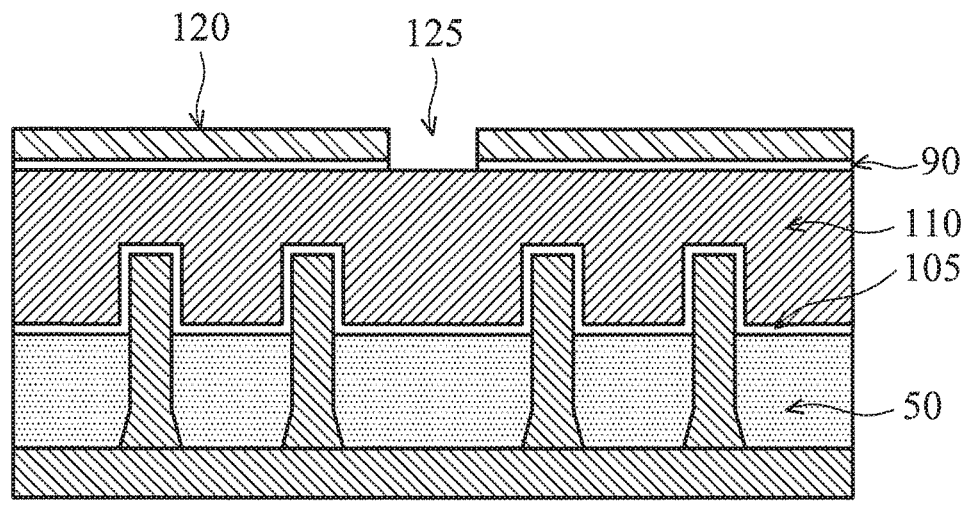
Figure 5B:
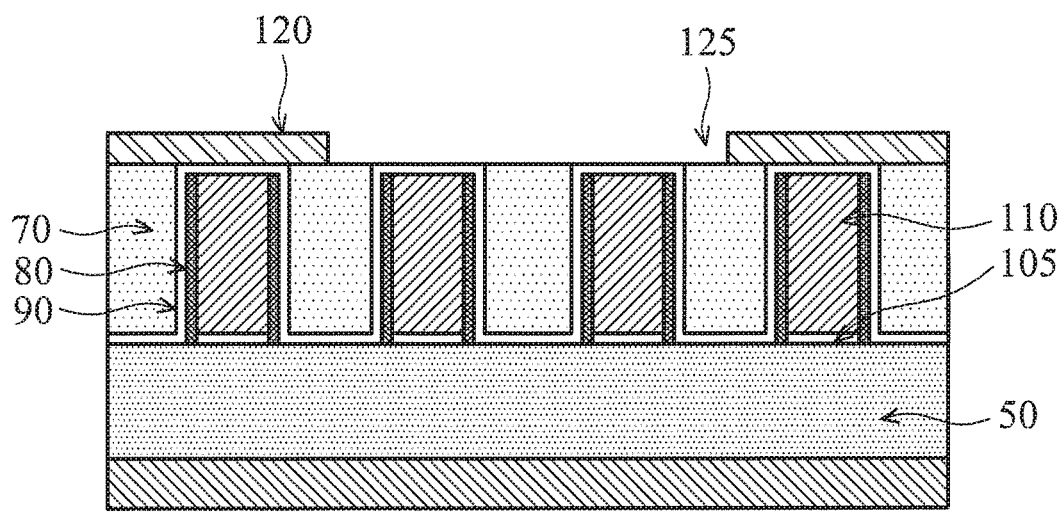
Figure 5C:
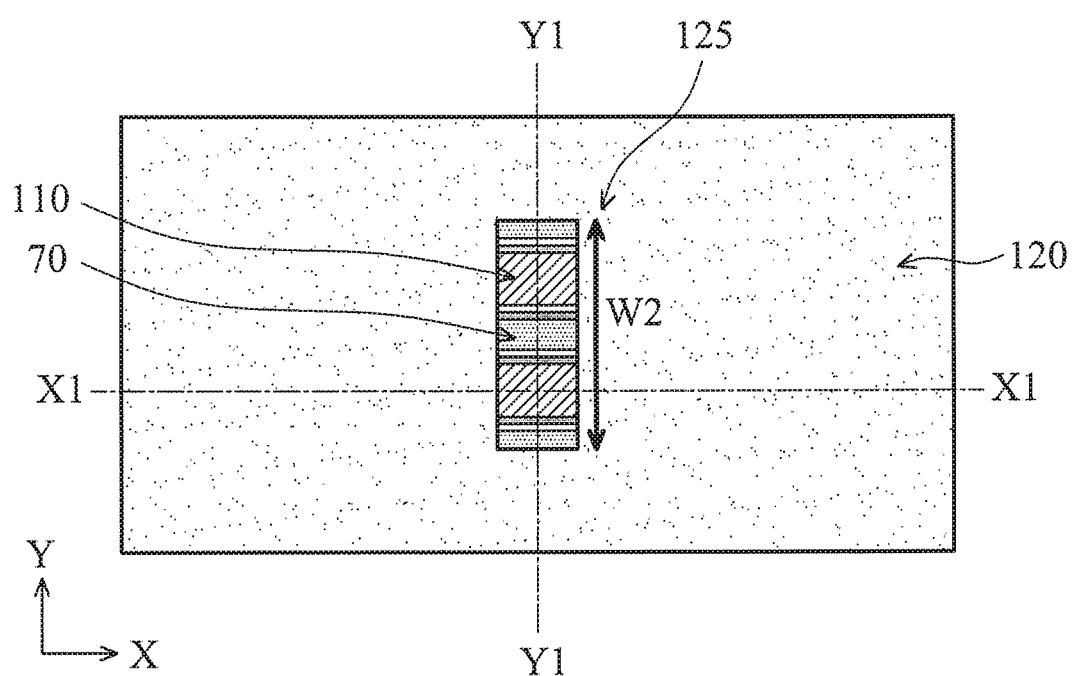

Next, as shown in FIGS. 5A-5C, a mask pattern 120 is formed over the structure shown in FIGS. 4A-4D. FIG. 5A is a cross sectional view corresponding to line X1-X1 in FIG. 4A, FIG. 5B is a cross sectional view corresponding to line Y1-Y1 in FIG. 4A, and FIG. 5C is a top view. The mask pattern 120 is formed by, for example, a material having a high etching selectivity to poly silicon. In one embodiment, the mask pattern 120 is made of silicon nitride. The mask pattern 120 has an opening 125. A width of the opening 125 along the X direction is in a range from about 5 nm to about 100 nm in some embodiments, and in a range from about 10 nm to 30 nm in other embodiments. The width W2 of the opening 125 along the Y direction is adjusted to expose a desired number of gate structures. In FIG. 5C, the width of the opening 125 along the Y direction is such a length that two gate structures are exposed in the opening 125, and the edges of the opening in the Y direction are located between the adjacent gate structures over the ILD 70.

Figure 6A:
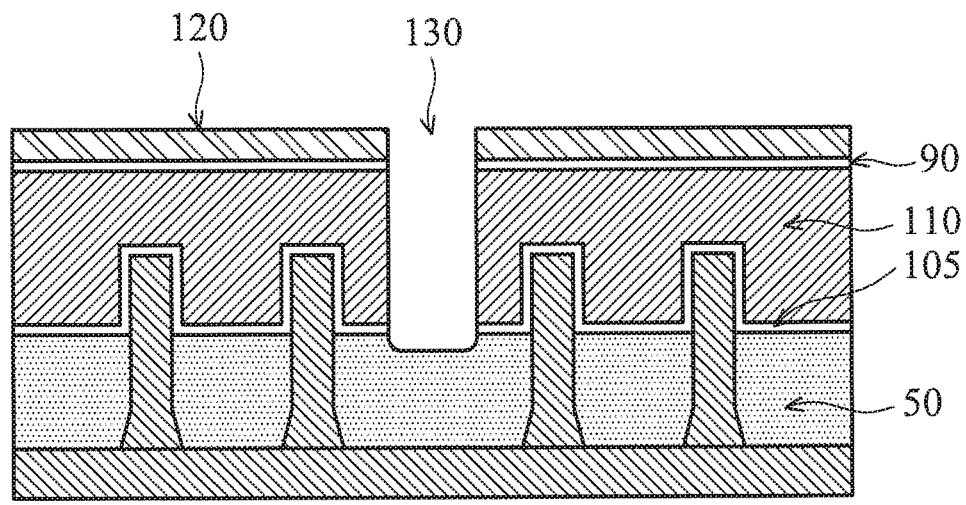
Figure 6B:
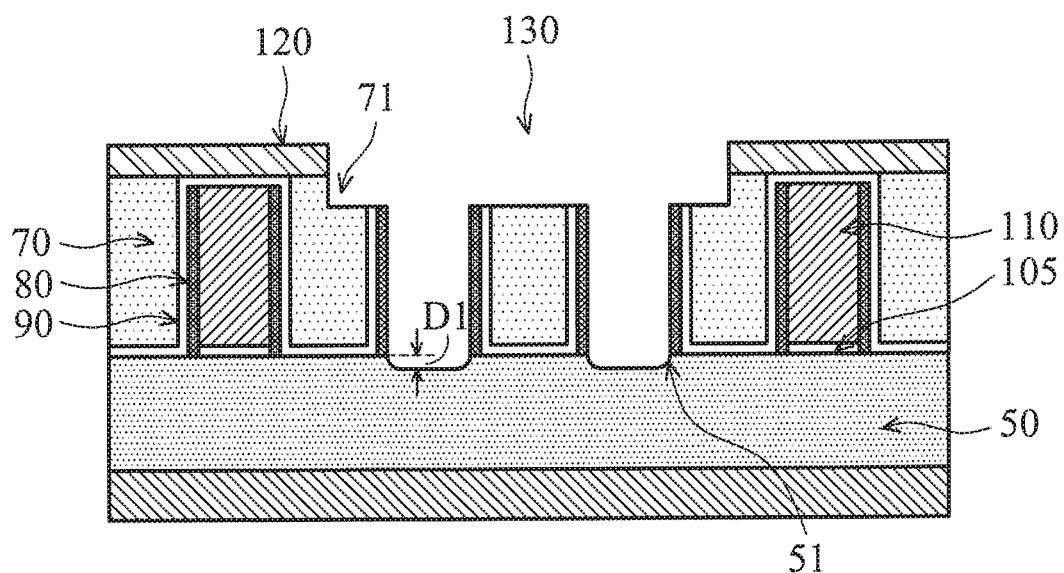

As shown in FIGS. 6A and 6B, by using the mask pattern 120 as an etching mask, a part of gate layer 110 and the gate insulating layer 105 are removed, so as to obtain a separation opening 130 that separates the gate layers 110. The etching of the gate layer is performed by plasma etching using gases including $CH_4$, $CF_4$, $CH_2F_2$, $CHF_3$, $O_2$, HBr, $Cl_2$, $NF_3$, $N_2$ and/or He under a pressure of 3 to 20 mTorr, in some embodiments.

The etching of the gate layer 110 accompanies etching the oxide layers (with different etching conditions than the poly silicon etching) including the gate insulating layer 105. During the oxide etching, the upper portion 71 of the ILD 70 and the surface portion 51 of the isolation insulating layer 50 are also etched, as shown in FIGS. 6A and 6B. The depth D1, which is an etched depth of the surface portion 51 of the isolation insulating layer 50 is in a range from about 1 nm to about 10 nm.

It is noted that the cross sectional views of the opening 130 has a rectangular shape in FIG. 6A, but in some embodiments, the opening 130 has a tapered shape having a larger top size and a smaller bottom size. Further, as shown in FIG. 6B, the sidewall insulating layers 80 and the CESL 90 remain in the openings 130.

Figure 7A:
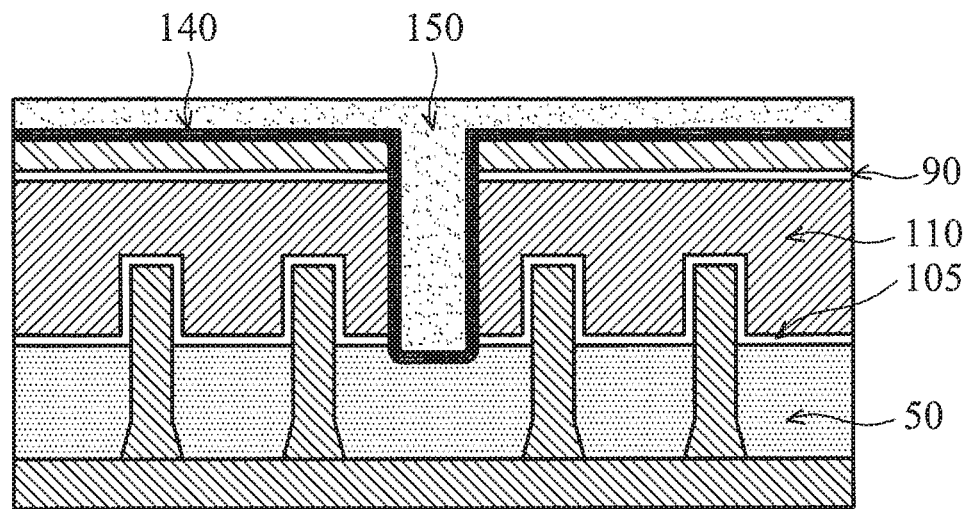
Figure 7B:
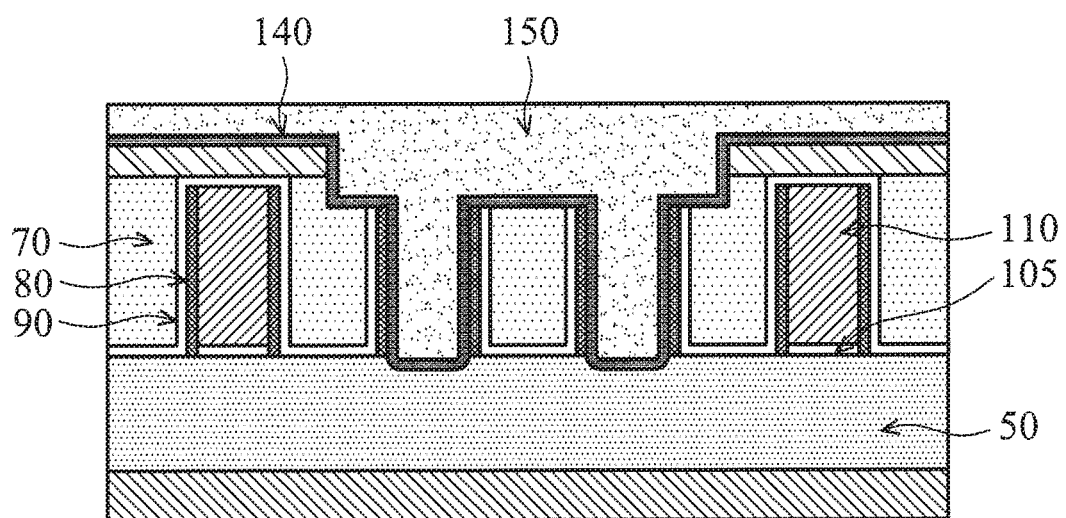

Then, as shown in FIGS. 7A and 7B, a thin filling insulating layer 140 and a thick filling insulating layer 150 are formed over the resultant structure of FIGS. 6A and 6B.

The thin insulating layer 140 is made of, for example, the same material as the gate insulating layer 105. In this embodiment, silicon oxide is used. The thin filling insulating layer 140 is made by CVD or ALD. The thickness of the thin filling insulating layer 140 is in a range from about 3 nm to about 25 nm in some embodiments, and is in a range from about 5 nm to about 15 nm in other embodiments. As shown in FIGS. 7A and 7B, the thin filling insulating layer 140 is conformally formed in the opening 130 and over the mask pattern 120.

The thick filling insulating layer 150 is made of silicon oxide or silicon nitride based materials such as SiN, SiCN, SiON or SiOCN. In one embodiment, silicon nitride is used. The thick filling insulating layer 150 is conformally formed over the thin filling insulating layer 140 in the opening 130 and over the mask pattern 120.

Figure 8A:
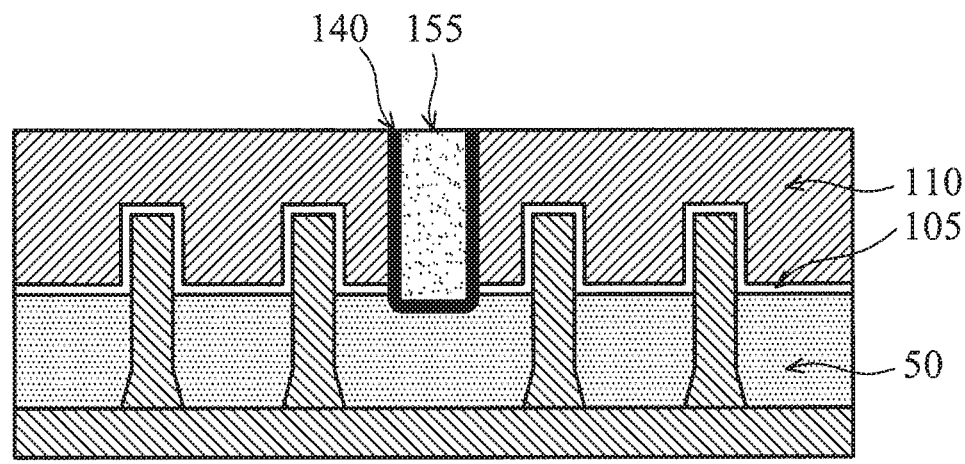
Figure 8B:
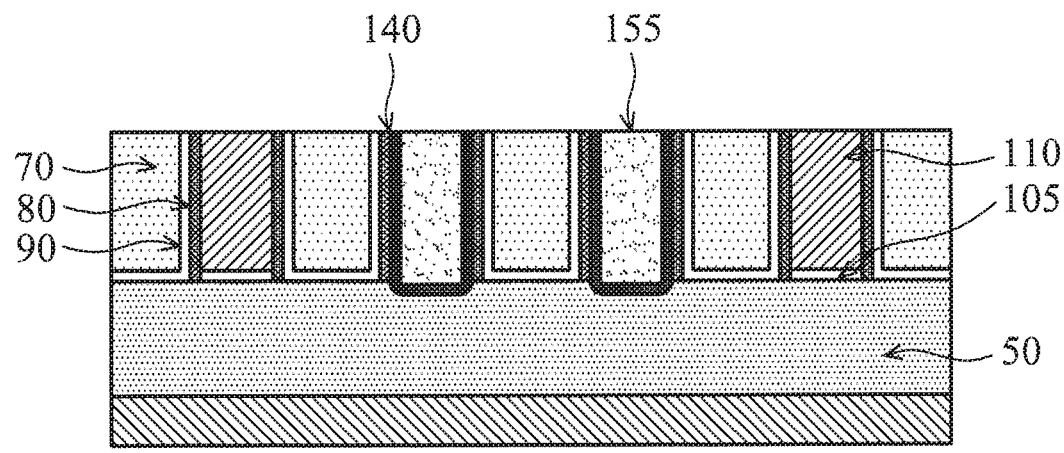

After the opening 130 is filled by the thin filling insulating layer 140 and the thick filling insulating layer 150, a planarization operation such as a CMP process is performed to expose the upper surface of the gate layers 110, as shown in FIGS. 8A and 8B. In other words, the gate layers 110 function as a stopper for the CMP process. By this planarization operation, a separation plug 155 is formed.

Figure 9A:
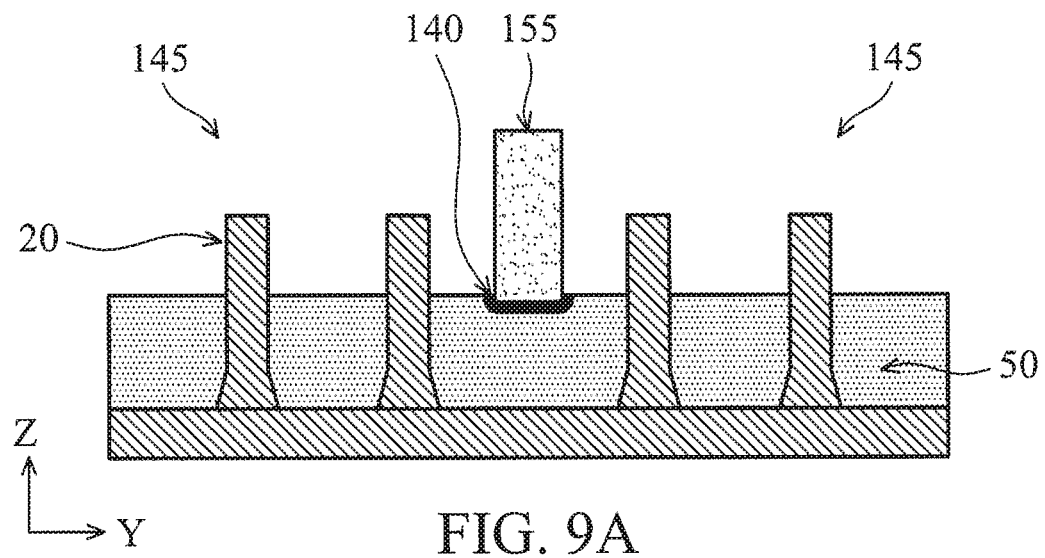
Figure 9B:
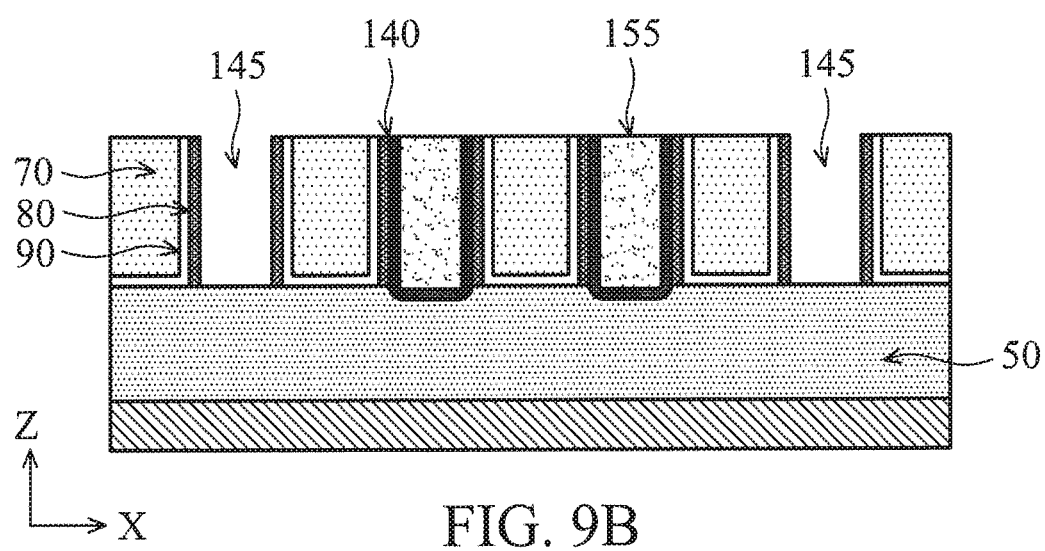

After the planarization operation to expose the gate layers 110, the gate layers 110 and gate insulating layer 105 (i.e., dummy layers) are removed by using dry etching and/or wet etching, thereby forming gate openings 145, as shown in FIGS. 9A and 9B. During the removal of the gate insulating layer 105, since the thin filling insulating layer 140 is made of the same material as the gate insulating layer 105 (e.g., silicon oxide), part of the thin filling insulating layer 140 exposed to the etching process is also removed. As shown in FIG. 9A, the thin filling insulating layer 140 which has been disposed between the gate layer 110 and the thick filling insulating layer 150 is removed.

Next, as shown in FIG. 10A-10D, metal gate structures including a gate dielectric layer 160 and a metal gate electrode layer 170 are formed.

In certain embodiments, the gate dielectric layer 160 includes one or more layers of dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The metal gate electrode layer 170 includes any suitable material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments, one or more work function adjustment layers (not shown) are also disposed between the gate dielectric layer 160 and the metal gate electrode layer 170. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

In forming the metal gate structures, the gate dielectric layer, the work function adjustment layer and the gate electrode layer are formed by suitable film forming method, for example, CVD or ALD for gate dielectric layer, and CVD, PVD, ALD or electroplating for the metal layers, and then a planarization operation such as CMP is performed.

Figure 10A:
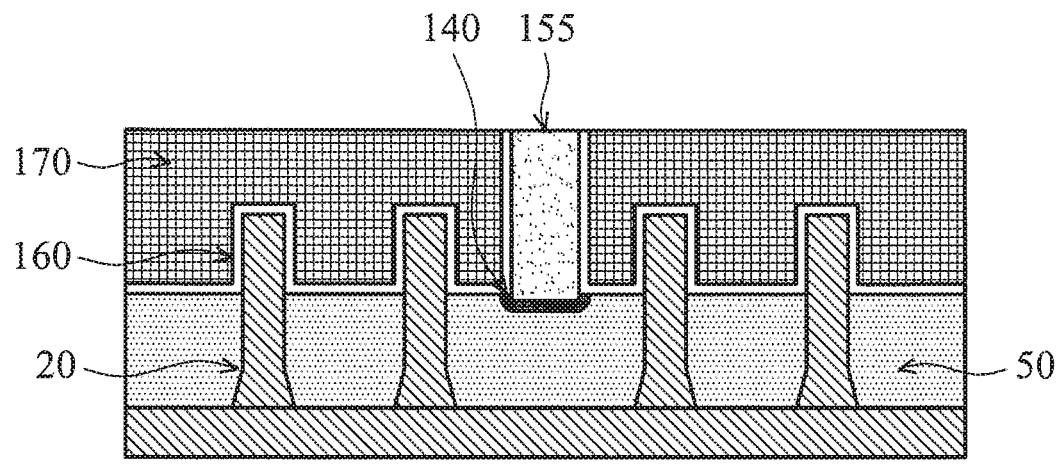
Figure 10B:
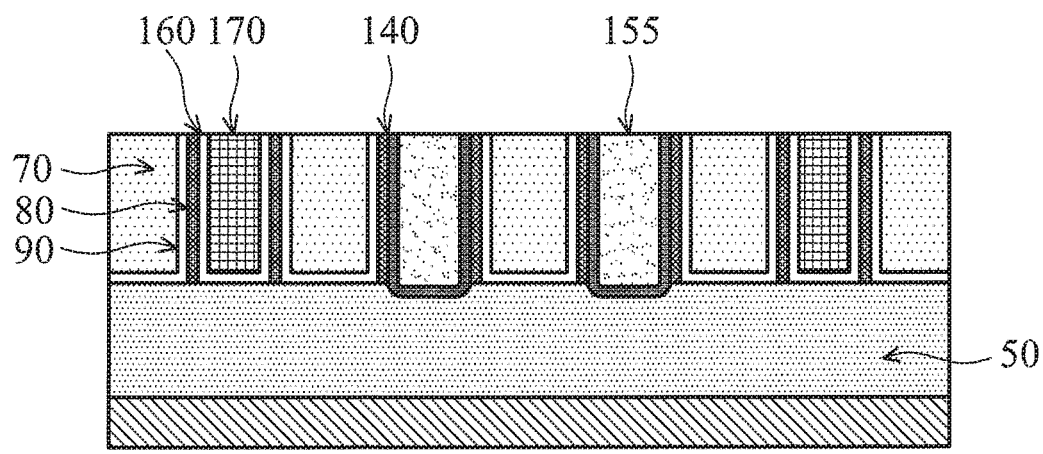
Figure 10C:
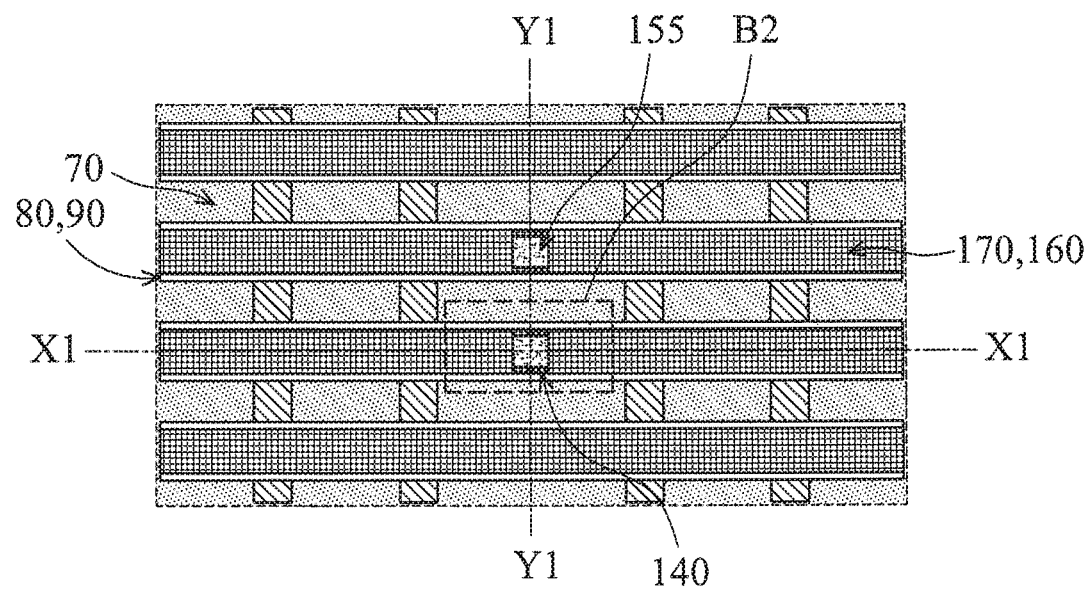
Figure 10D:
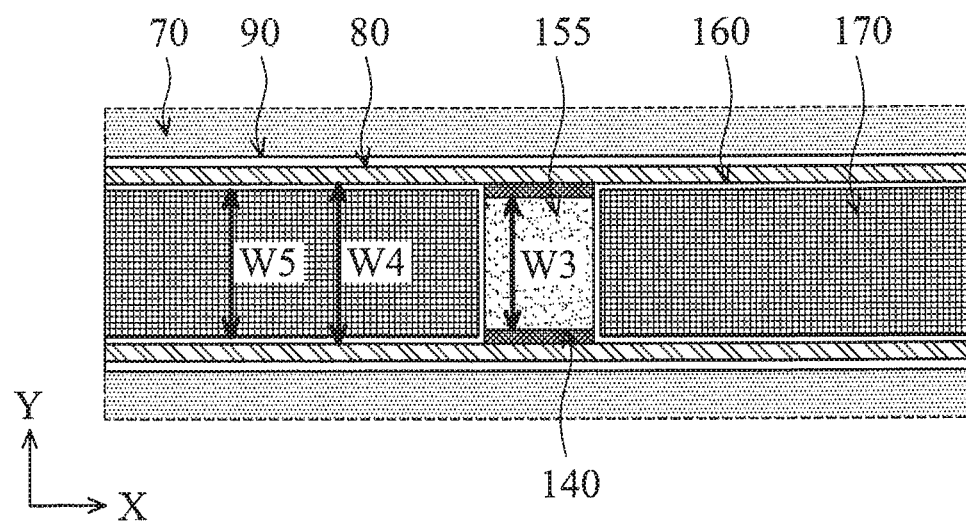

FIGS. 10C and 10D show top views after the metal gate structures are formed. FIG. 10D is an enlarged view of the enclosed portion B2 in FIG. 10C. As shown in FIGS. 10C and 10D, the metal gate structures (160, 170) are separated by a separation plug 155. As shown in FIG. 10D, the width W3 along the Y direction (perpendicular to the X direction which is an extending direction of the metal gate structures)

of the separation plug is smaller than the width W4 along the Y direction of the gate structure including the gate dielectric layer 160 and the gate electrode layer 170 due to the thin insulating filling layer 140. In some embodiments, the width W3 along the Y direction of the separation plug is smaller than the width W5 along the Y direction of the gate dielectric layer 160.

It is understood that the structure shown in FIGS. 10A-10D undergoes further CMOS processes to form various features such as interconnect vias, interconnect metal layers, passivation layers, etc.

In the foregoing embodiment, the gate layer 110 is separated into two gate layers. However, in other embodiments, the gate layer 110 is separated into more than two gate layers by the patterning operations of FIGS. 6A-8B. In such a case, as shown in FIG. 11A, multiple gate structures each including the gate electrode layer 170 are aligned and separated by separation plugs 155.

Further, the gate layer 110 has two ends in its longitudinal direction before the separation operation. In some embodiments, the separation plug 155 is formed in at least one of these ends, as shown in area B3 of FIG. 11A. In such a case, the gate structure including the gate electrode layer 170 is sandwiched by two separation plugs 155. In some embodiment, both ends have the separation plugs 155.

Figure 11A:
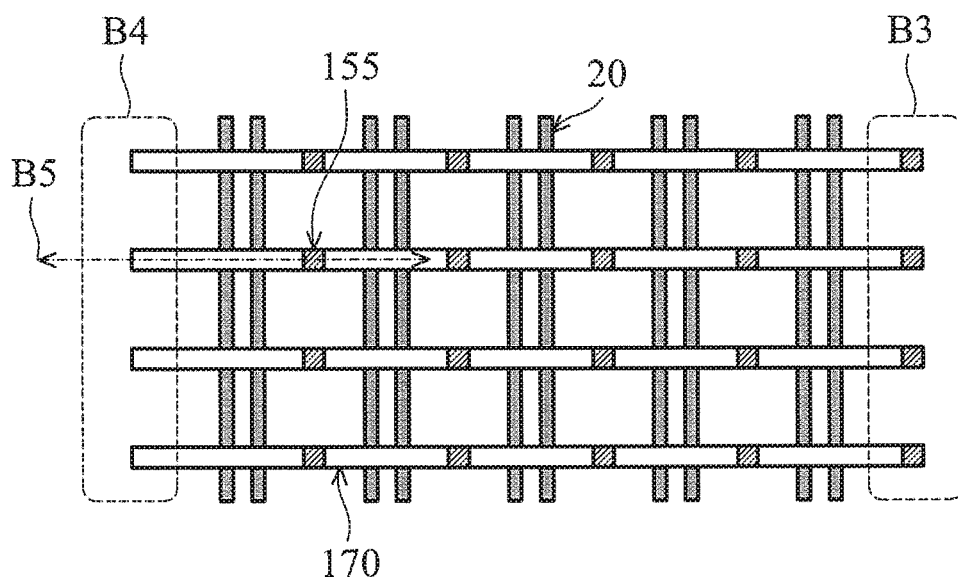
FIGS. 11A and 11B show an exemplary structure of an FET device according to another embodiment of the present disclosure.
Figure 11B:
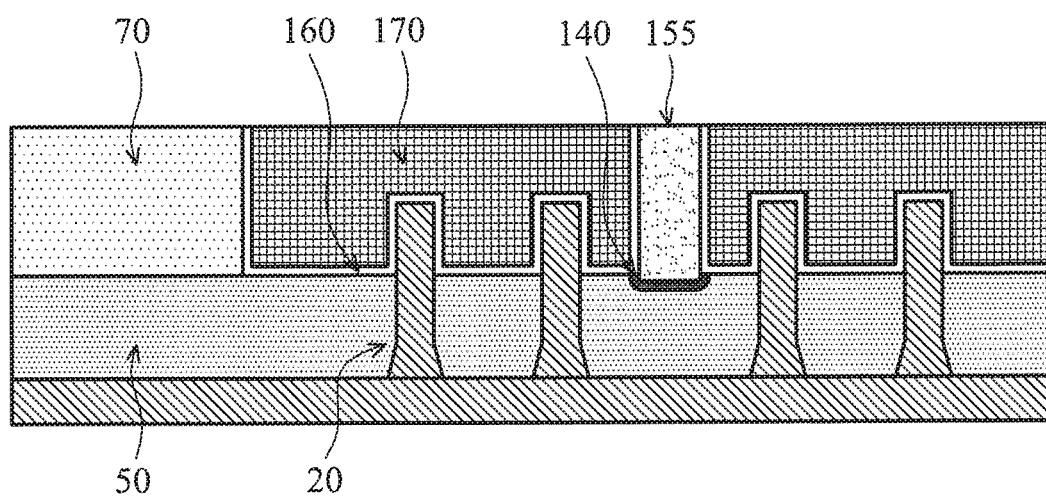

In other embodiments, the separation plug 155 is not formed in at least one of the ends, as shown in area B4 of FIG. 11A. In such a case, one end of the gate structure including the gate electrode layer 170 has a separation plug 155 and the other end of the gate structure has the structure shown in FIG. 11B. FIG. 11B is a cross sectional view of line B5 of FIG. 11A. As shown in FIG. 11B, the gate structure, in particular the gate dielectric layer 160 is in contact with the ILD 70. In some embodiment, both ends have no separation plugs 155.

Figure 12:
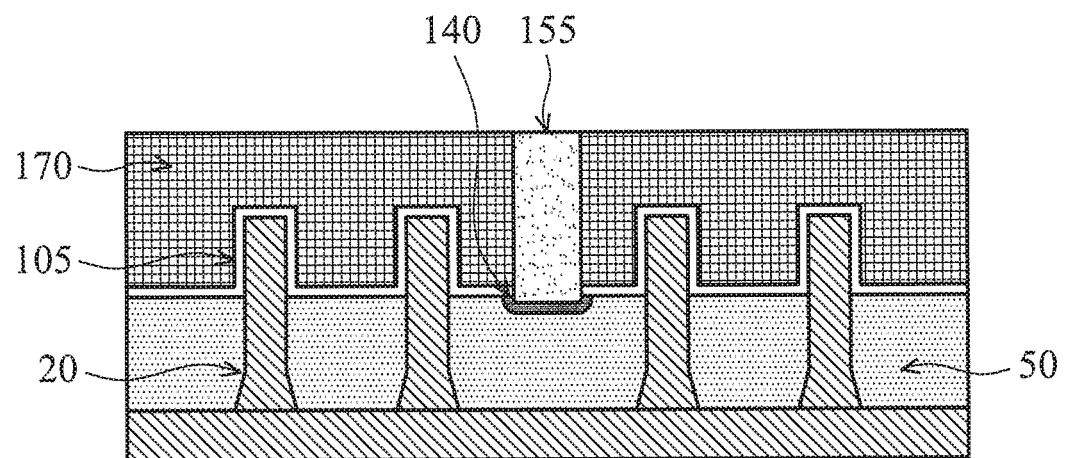
FIG. 12 shows an exemplary structure of an FET device according to one embodiment of the present disclosure.

In another embodiment, a gate insulating layer 105 is not a dummy layer and is made of dielectric material finally used in the FET device. In such a case, a high-k dielectric material described above can be used. When the gate insulating layer 105 is not a dummy layer, the gate insulating layer 105 is made of a different material than the thin filling insulating layer 140. In the operation with respect of FIGS. 9A and 9B, the gate insulating layer 105 (e.g., a high-k dielectric material) is not removed in the openings 145. Then, an additional operation to remove the thin filling insulating layer 140 is performed to obtain the structure similar to FIG. 9A, except for the existence of the gate insulating layer 105. In this case, the metal gate electrode layer 170 is in contact with the separation plug 150, as shown in FIG. 12, because the formation of the gate dielectric layer 160 (see, FIG. 10A) is not necessary.

Figure 13:
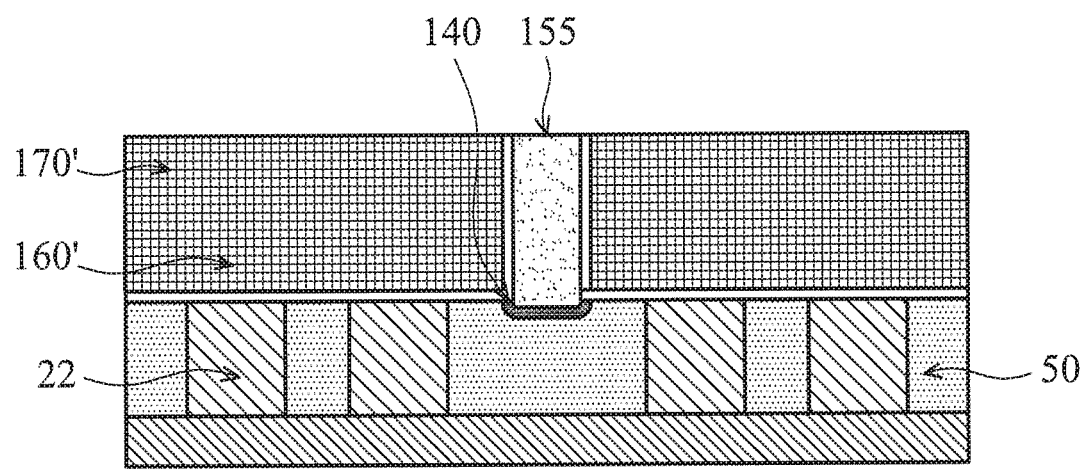
FIG. 13 shows an exemplary structure of an FET device according to another embodiment of the present disclosure.

In the above embodiments, a Fin FET is employed. However, the foregoing technologies can be applied to a planar type FET, as shown in FIG. 13. As shown in FIG. 13, the FET includes a channel region 22 of a semiconductor substrate and a gate structure including a gate dielectric layer 160' formed over the channel region 22 and a gate electrode layer 170' formed over the gate dielectric layer 160'. The channel regions are separated by the isolation insulating layers 50 and two gate structures are separated by a separation plug 155.

The various embodiments or examples described herein offer several advantages over the existing art. For example, since the thin insulating filling layer 140 is eventually removed, the width in the Y direction of the gate space to be filled by metal gate materials can become larger. With the enlarged gate opening, the metal gate materials such as a metal gate electrode material can be fully filled in the opening without forming voids.

It will be understood that not all advantages have been necessarily discussed herein, no particular advantage is required for all embodiments or examples, and other embodiments or examples may offer different advantages.

In accordance with one aspect of the present disclosure, a semiconductor device includes a first fin field-effect transistor (Fin FET) and a second Fin FET. The first Fin FET includes a first fin structure extending in a first direction and a first gate structure. The first gate structure includes a first gate dielectric layer formed over the first fin structure and a first gate electrode layer formed over the first gate dielectric layer, and extends in a second direction perpendicular to the first direction. The second Fin FET includes a second fin structure extending in the first direction and a second gate structure. The second gate structure includes a second gate dielectric layer formed over the second fin structure and a second gate electrode formed over the second gate dielectric layer, and extends in the second direction. The first gate structure and the second gate structure are aligned along the second direction. The first gate structure and the second gate structure are separated by a separation plug made of an insulating material. A width of the separation plug in the first direction is smaller than a width of the first gate structure in the first direction, when viewed in plan view.

In accordance with another aspect of the present disclosure, a semiconductor device includes a first field-effect transistor (FET) and a second FET. The first FET includes a first channel region of a semiconductor substrate and a first gate structure. The first gate structure includes a first gate dielectric layer formed over the first channel region and a first gate electrode layer formed over the first gate dielectric layer, and extends in a first direction. The second FET includes a second channel region of the semiconductor substrate and a second gate structure. The second gate structure includes a second gate dielectric layer formed over the second channel region and a second gate electrode layer formed over the second gate dielectric layer, and extends in the first direction. The first gate structure and the second gate structure are aligned along the first direction. The first gate structure and the second gate structure are separated by a separation plug made of an insulating material. A width of the separation plug in a second direction perpendicular to the first direction is smaller than a width of the first gate structure in the second direction, when viewed in plan view.

In accordance with another aspect of the present disclosure, a method for manufacturing a semiconductor device includes forming a dummy gate structure over channel regions formed over a substrate. The dummy gate structure includes a dummy gate electrode layer, a dummy gate dielectric layer and sidewall spacer layers disposed on both sides of the dummy gate electrode layer. The method includes forming interlayer dielectric layers at both sides of the dummy gate structure. The method further includes patterning the dummy gate structure so that the dummy gate structure is divided into at least a first dummy gate structure and a second dummy gate structure separated by a separation opening. The method includes forming a separation plug by filling the separation opening with a first insulating material and a second insulating material different from the first insulating material. The method includes removing the dummy gate electrode layer and the dummy gate dielectric layer from the first dummy gate structure and the second dummy gate structure, so that a first electrode space and a second electrode space are formed and the separation plug is exposed between the first electrode space and the second electrode space. The method includes forming a first gate structure and a second gate structure in the first electrode space and the second electrode space, respectively. During the removing the dummy gate dielectric layer, portions of the first insulating material exposed to the first electrode space and the second electrode space are removed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first fin field-effect transistor (Fin FET) including a first fin structure extending in a first direction and a first gate structure, the first gate structure including a first gate dielectric layer formed over the first fin structure and a first gate electrode layer formed over the first gate dielectric layer and extending in a second direction perpendicular to the first direction;
a second Fin FET including a second fin structure extending in the first direction and a second gate structure, the second gate structure including a second gate dielectric layer formed over the second fin structure and a second gate electrode layer formed over the second gate dielectric layer and extending in the second direction; and
sidewall spacers extending in the second direction, between which the first and second gate structures are disposed, wherein:
the first gate structure and the second gate structure are aligned along the second direction and are separated by a separation plug made of an insulating material,
the first and second gate structures are in direct contact with the separation plug, and
an additional insulating layer is disposed between the separation plug and the sidewall spacers.

2. The semiconductor device of claim 1, wherein a material forming the separation plug is different from a material forming the additional insulating layer.

3. The semiconductor device of claim 2, wherein the additional insulating layer is made of silicon oxide and the separation plug is made of a silicon nitride based material.

4. The semiconductor device of claim 1, wherein the additional insulating layer continuously covers a bottom of the separation plug.

5. The semiconductor device of claim 1, wherein the separation plug is in direct contact with the first gate dielectric layer and the second gate dielectric layer.

6. The semiconductor device of claim 1, wherein the separation plug is in direct contact with the first gate electrode layer and the second gate electrode layer.

7. The semiconductor device of claim 1, wherein:
the first and second gate structures are disposed on an upper surface of an isolation insulating layer, and
a bottom of the separation plug is located below the upper surface of the isolation insulating layer.

8. The semiconductor device of claim 7, wherein the additional insulating layer extends below the bottom of the separation plug so that the additional insulating layer is disposed between the separation plug and the isolation insulating layer.

9. The semiconductor device of claim 1, wherein:
the first gate structure has a first end and a second end in the second direction,
the first end of the first gate structure is in contact with the separation plug, and
the second end of the first gate structure is in contact with an interlayer dielectric layer different from the separation plug.

10. A semiconductor device, comprising:
a first gate structure disposed over one or more fin structures, the first gate structure including a first gate dielectric layer and a first gate electrode layer formed over the first gate dielectric layer and extending in a first direction;
a second gate structure disposed over one or more fin structures, the second gate structure including a second gate dielectric layer and a second gate electrode layer formed over the second gate dielectric layer and extending in the first direction; and
sidewall spacers extending in the second direction, between which the first and second gate structures are disposed, wherein:
the first gate structure and the second gate structure are aligned along the second direction and are separated by a separation plug made of an insulating material,
the first and second gate structures are in direct contact with the separation plug, and
an additional insulating layer is disposed between the separation plug and the sidewall spacers.

11. The semiconductor device of claim 10, wherein a width of the separation plug in a second direction perpendicular to the first direction is smaller than a width of the first gate structure in the second direction, in plan view.

12. The semiconductor device of claim 11, wherein the width of the separation plug in the second direction is smaller than a width of the first gate electrode layer in the second direction, in plan view.

13. The semiconductor device of claim 10, wherein a material forming the separation plug is different from a material forming the additional insulating layer.

14. The semiconductor device of claim 13, wherein the additional insulating layer is made of silicon oxide and the separation plug is made of a silicon nitride based material.

15. The semiconductor device of claim 10, wherein the additional insulating layer continuously covers a bottom of the separation plug.

16. The semiconductor device of claim 10, wherein the separation plug is in direct contact with the first gate dielectric layer and the second gate dielectric layer.

17. The semiconductor device of claim 10, wherein the separation plug is in direct contact with the first gate electrode layer and the second gate electrode layer.

18. The semiconductor device of claim 10, wherein:
the first and second gate structures are disposed on an upper surface of an isolation insulating layer, and
a bottom of the separation plug is located below the upper surface of the isolation insulating layer.

19. A semiconductor device, comprising:
a fin field-effect transistor (Fin FET) including fin structures extending in a first direction and a gate structure disposed over the fin structures, the gate structure including a gate dielectric layer formed over the fin structures and a gate electrode layer disposed over the gate dielectric layer and extending in a second direction perpendicular to the first direction;

sidewall spacers, between which the gate structure is disposed; and a first insulating plug disposed one end of the gate structure, wherein:

the gate structure is in direct contact with the first insulating plug, and an additional insulating layer is disposed between the first insulating plug and the sidewall spacers.

20. The semiconductor device of claim 19, further comprising an a second insulating plug disposed on another end of the gate structure, wherein the gate structure is in direct contact with the second insulating plug, and an additional insulating layer is disposed between the second insulating plug and the sidewall spacers.

* * * * *